(12) United States Patent
Mahanpour et al.

(10) Patent No.: US 6,253,353 B1
(45) Date of Patent: Jun. 26, 2001

(54) METHOD AND SYSTEM FOR PROVIDING A LIBRARY FOR IDENTIFYING $V_{CC}$ TO GROUND SHORTS IN A CIRCUIT IN A SEMICONDUCTOR DEVICE

(75) Inventors: Mehrdad Mahanpour, Union City; Jose Hulog, San Jose, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/248,136

(22) Filed: Feb. 10, 1999

(51) Int. Cl.[7] ............................................. H03D 3/46
(52) U.S. Cl. .............................. 716/4; 257/263; 438/14; 438/30
(58) Field of Search .................. 716/4; 257/263, 257/48; 430/311; 326/83; 438/14, 30

(56) References Cited

U.S. PATENT DOCUMENTS 5,296,125 * 3/1994 Glass et al. ........................ 430/311
5,977,558 * 11/1999 Lee ..................................... 257/48
6,034,552 * 3/2000 Chang et al. ...................... 326/83

OTHER PUBLICATIONS

Oh, Soo–Young, et al.; Interconnect modeling for VLSIs; Simulation of Semiconductor Processes & Device; 1999; pp. 203–206.*
Lin, A.Y.C., et al.; "Reducing the start–up process duration for semiconductor facilities"; IEEE Advanced Semiconductor Manufacturing Conference & Workshop; 1997; p. 202.*
Jianjun, Hou, et al.; "A much simplified thyristor model in computer–aided analysis and design"; International Conference on Circuits and Systems; 1991; vol. 2, pp. 670–673.*

* cited by examiner

Primary Examiner—Matthew Smith
Assistant Examiner—Jibreel Speight
(74) Attorney, Agent, or Firm—Sawyer Law Group LLP

(57) ABSTRACT

A system and method for detecting a type of a short of a plurality of types of shorts in a circuit in a semiconductor device is disclosed. The circuit includes a plurality of power supply lines and a plurality of ground lines. The short is between at least one of the plurality of power supply lines and at least one of the plurality of ground lines. In one aspect, the method and system include providing a library including a plurality of sets of current-voltage characteristics. Each of the plurality of sets of current-voltage characteristics is for a particular type of short of the plurality of types of shorts. In this aspect, the method and system further include measuring a particular set of current-voltage characteristics of the semiconductor device and comparing the particular set of current-voltage characteristics to the plurality of sets of current-voltage characteristics in the library. The type of short may be determined based on the comparison between the particular set of current-voltage characteristics and the plurality of sets of current-voltage characteristics in the library. In another aspect, the method and system provide a tool for detecting the type of a short. In this aspect, the method and system include creating a plurality of types of shorts in a functioning semiconductor device, measuring a plurality of sets of current-voltage characteristics for the functioning semiconductor device, and saving the plurality of sets of current-voltage characteristics in a library.

16 Claims, 4 Drawing Sheets

METHOD AND SYSTEM FOR PROVIDING A LIBRARY FOR IDENTIFYING $V_{CC}$ TO GROUND SHORTS IN A CIRCUIT IN A SEMICONDUCTOR DEVICE

FIELD OF THE INVENTION

The present invention relates to semiconductor devices and more particularly to a method and system for providing a library for identifying $V_{CC}$ to ground shorts rapidly and easily.

BACKGROUND OF THE INVENTION

Circuits formed in semiconductor devices utilize a power supply, called $V_{CC}$, and a ground. Electrical connection is made to $V_{CC}$ and ground through metal lines in the circuits. The metal lines are typically formed in layers. The lines to $V_{CC}$ and ground are designed to be connected only through the circuits. However, the lines between $V_{CC}$ and ground may be shorted. When $V_{CC}$ is shorted to ground, the circuits in the semiconductor device do not function. Thus, detection of these shorts is desirable.

One conventional method for detecting shorts uses liquid crystals. A layer of a liquid crystal is poured on a surface of the device and power provided to the circuits of the device. The $V_{CC}$ to ground shorts may generate heat. The heat generated may cause the liquid crystal to change phase or move. Thus, the positions of the shorts in the plane of the semiconductor device may be determined. Another conventional method for detecting shorts deprocesses the semiconductor device in which the power supply, $V_{CC}$, is shorted to ground. As the device is deprocessed layer by layer, each metal layer is investigated to determine if the short exists between lines in that layer. When the short is found, the information can be provided to those fabricating the device, and fabrication changed to reduce the likelihood of shorts.

Although the conventional methods can detect shorts, they are difficult to perform and time consuming. Liquid crystal detection requires careful control of the thickness of the liquid crystal. Liquid crystal also does not reveal in which metal layer the short is located. Thus, deprocessing may still be required. In addition, liquid crystal detection may not be capable of locating shorts which are relatively far from the surface on which the liquid crystal is placed because heat is dissipated in the device. Conventional deprocessing is also time consuming. In addition, deprocessing may inadvertently destroy the short. Thus, many semiconductor devices may need to be investigated before the location of the $V_{CC}$ to ground short can be found. Thus, conventional methods for locating $V_{CC}$ to ground shorts are time consuming and difficult to perform. Thus, it may take a relatively long time to be able to change the processes in fabrication which cause the shorts.

Accordingly, what is needed is a system and method for easily and rapidly detecting $V_{CC}$ to ground shorts. The present invention addresses such a need.

SUMMARY OF THE INVENTION

The present invention provides a system and method for detecting a type of a short of a plurality of types of shorts in a circuit in a semiconductor device. The circuit includes a plurality of power supply lines and a plurality of ground lines. The short is between at least one of the plurality of power supply lines and at least one of the plurality of ground lines. In one aspect, the method and system comprise providing a library including a plurality of sets of current-voltage characteristics. Each of the plurality of sets of current-voltage characteristics is for a particular type of short of the plurality of types of shorts. In this aspect, the method and system further comprise measuring a particular set of current-voltage characteristics of the semiconductor device and comparing the particular set of current-voltage characteristics to the plurality of sets of current-voltage characteristics in the library. The type of short may be determined based on the comparison between the particular set of current-voltage characteristics and the plurality of sets of current-voltage characteristics in the library. In another aspect, the method and system provide a tool for detecting the type of a short. In this aspect, the method and system comprise creating a plurality of types of shorts in a functioning semiconductor device, measuring a plurality of sets of current-voltage characteristics for the functioning semiconductor device, and saving the plurality of sets of current-voltage characteristics in a library.

According to the system and method disclosed herein, the present invention allows for rapid, relatively simple detection of shorts between the power supply and ground. In addition, the present invention allows for relatively simple creation of a library for short detection.

DETAILED DESCRIPTION OF THE INVENTION

The present invention relates to an improvement in detection of $V_{CC}$ to ground shorts in semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
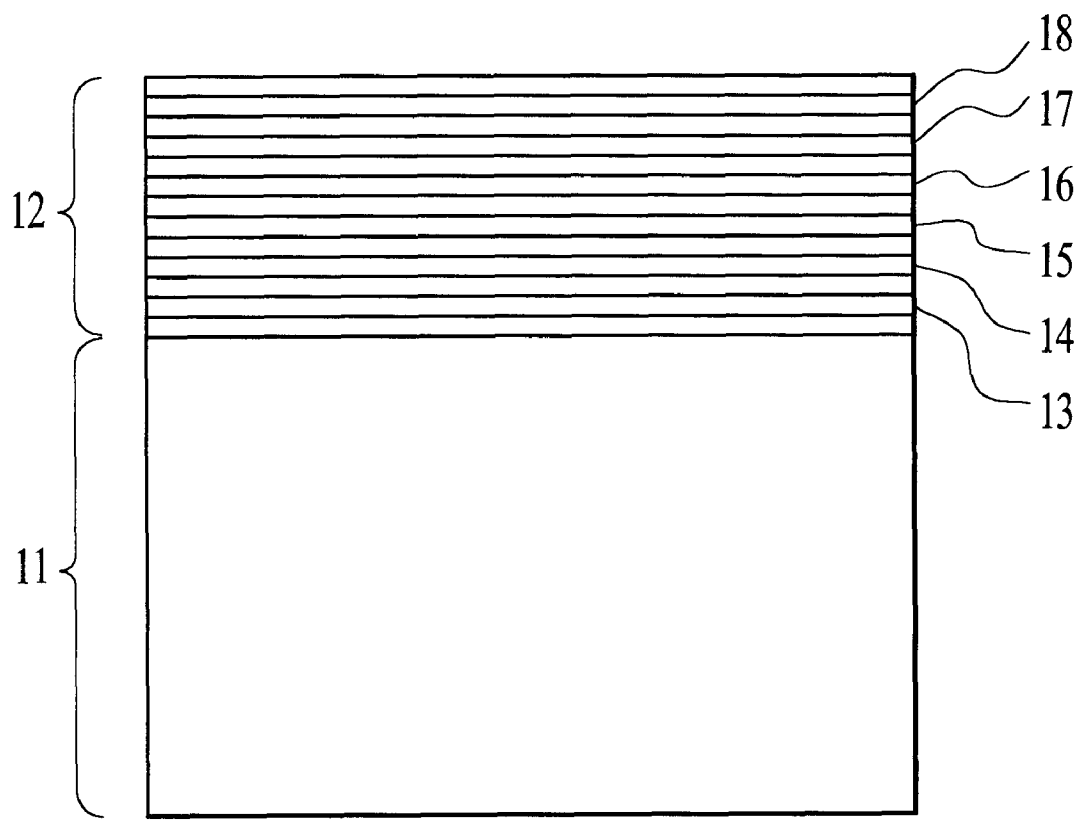
FIG. 1 depicts a semiconductor die.

FIG. 1 depicts a semiconductor die 10. The semiconductor die includes an active region 12 and a substrate region 11. Circuits are formed in the active region 12, while no circuits are formed in the second region 11. In a conventional semiconductor package, the die 10 is mounted on a die paddle (not shown0 with the active area 12 away from the die paddle. In a flip-chip package, the die 10 is mounted with the active area in proximity to the die paddle.

Circuits in semiconductor devices require power to function. Thus, the circuits are connected to a power supply (not shown), $V_{CC}$, and to ground (not shown). The power supply and the ground are designed to be coupled only through the circuits within the semiconductor device. Electrical connection is made to $V_{CC}$ and ground through metal lines in the circuits. The metal lines are typically formed in layers. The die 10 depicted in FIG. 1 includes six metal layers 13, 14, 15, 16, 17, and 18. A die in another semiconductor device may include a different number of metal layers. Thus, some semiconductor devices include several metal layers while other semiconductor devices only include a few metal layers. For example, a simpler semiconductor process may include only two metal layers, while a more complex semiconductor process may include six metal layers.

The lines in the metal layers 13–18 are formed during fabrication. During processing, each of the metal layers 13–18 is provided. The layer is then masked and etched to form individual lines. An insulator is then provided to cover the metal lines. Thus, each metal layer 13–18 depicted in FIG. 1 is made up of a plurality of metal lines. Some of the metal lines are coupled with the power supply, while others are coupled to ground. Further metal lines are provided in subsequent layers using a similar process. Thus, the lines in metal layers 13–18 are separated by insulating layers.

In some semiconductor devices, the lines between $V_{CC}$ and ground may be shorted. For example, the etch which delineates the metal lines may be incomplete, leaving a small amount of metal connecting the lines. It is also possible, though less likely, that lines may be shorted between metal layers. When $V_{CC}$ is shorted to ground, the circuits in the semiconductor device do not function. Thus, detection of these shorts is desirable to improve the yield of the fabrication process.

Figure 2A:
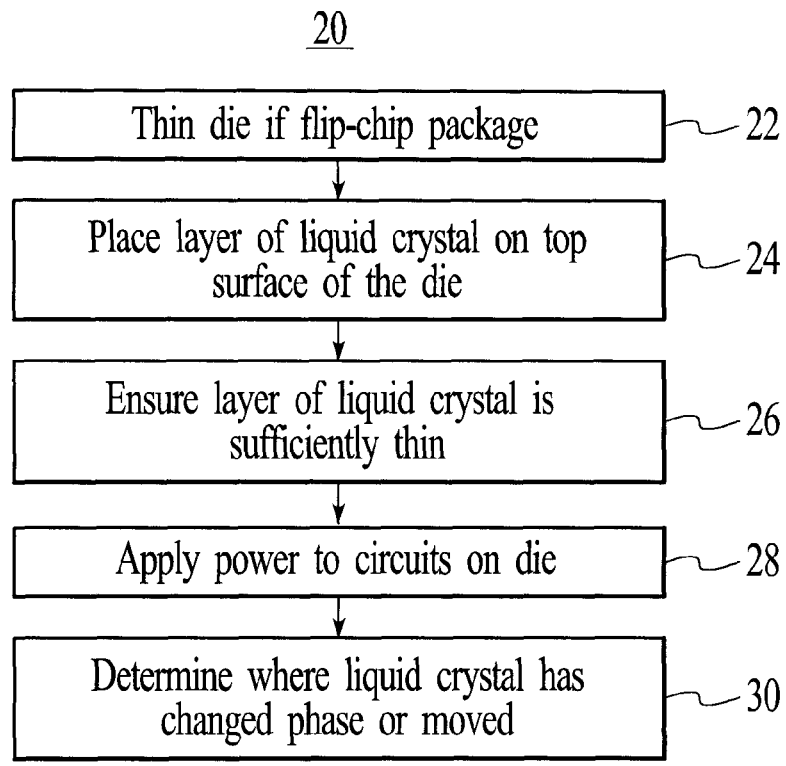
FIG. 2A is a flow chart of a conventional method for detecting $V_{CC}$ to ground shorts in a semiconductor device using liquid crystals.

FIG. 2A depicts a conventional method 20 for detecting shorts in a semiconductor device using a liquid crystal. The method 20 may be used in a conventional semiconductor device or for a flip-chip package. If a flip-chip package is being investigated, then the substrate portion 11 of the semiconductor die 10 is thinned, via step 22. Step 22 allows the liquid crystal to be closer to the short generating heat. A layer of a liquid crystal (not shown) is placed on the top surface of the die 10, via step 24. In step 24, the liquid crystal is placed on a surface in proximity to the circuits. In a flip-chip package, this surface has been exposed by thinning of the back side of the die 10. In order to ensure that the liquid crystal will function adequately, the layer of liquid crystal must be sufficiently thin. Thus, via step 26, it is ensured that the liquid crystal is thin enough to allow for fault detection. Step 26 requires precise measurement of the thickness of the liquid crystal. Typically, step 26 is performed using the interference of light. Light is shined on the liquid crystal. The liquid crystal is determined to have the correct thickness when a particular rainbow effect can be seen in the liquid crystal. The rainbow is due to the interference of light transmitted by the liquid crystal and reflected off of the semiconductor die. Once the liquid crystal has the correct thickness, power is applied to the circuits, via step 28. The $V_{CC}$ to ground shorts will generate heat when power is applied to the circuits. The liquid crystal may undergo a phase transition over hot spots, portions of the circuit in the immediate vicinity of the faults. The phase transition causes the liquid crystal over the portions of the circuit in which faults exist to change color. Alternatively, the heat generated by shorts could cause the liquid crystal to move way from the hot spots. Thus, it is determined via step 30 where the liquid crystal has changed phase or moved. By determining where the liquid crystal has changed phase or moved, the existence and location of $V_{CC}$ to ground shorts can be determined.

Figure 2B:
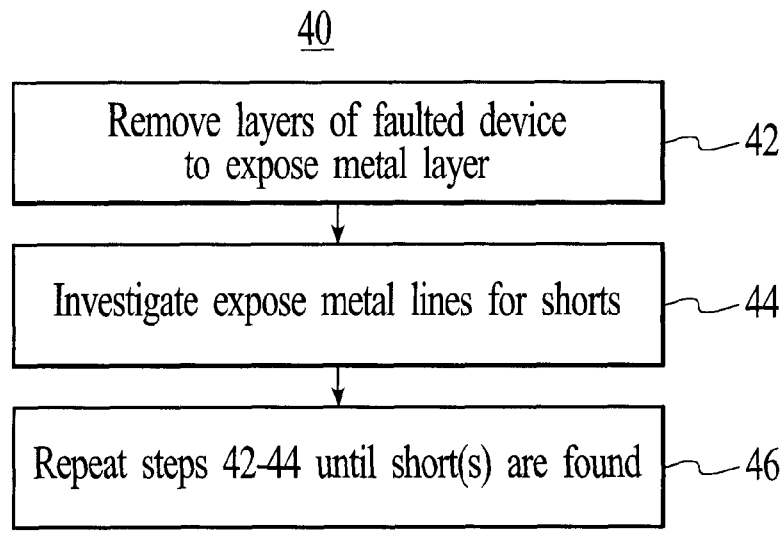
FIG. 2B is a flow chart of a conventional method for detecting $V_{CC}$ to ground shorts in a semiconductor device by deprocessing.

FIG. 2B depicts a second conventional method 40 for detecting shorts in a semiconductor device. Layers of the semiconductor device, including portions of the die 10, are removed to expose one of the metal layers 13–18, via step 42. The exposed metal layer is then investigated to determine whether the $V_{CC}$ to ground shorts are in that layer, via step 44. Steps 42 and 44 are then repeated to expose and investigate subsequent metal layers until the shorts are found.

Although the methods 20 and 40 can detect shorts, those with ordinary skill in the art will realize that the methods 20 and 40 have several drawbacks. With regard to the method 20, the step 26 of ensuring that the liquid crystal has the proper thickness is relatively difficult to perform. This makes detection of faults relatively time consuming and difficult. One of ordinary skill in the art will also realize that liquid crystal detection can only determine where in the plane of the die 10 the shorts can be found. Thus, conventional liquid crystal detection does not indicate in which metal layer 13–18 within the die 10 the shorts exist. Moreover, the die 10 dissipates heat relatively rapidly. Thus, in relatively complex devices having several metal layers, such as in the die 10, conventional liquid crystal detection may not detect shorts in metal layers, such as layers 13, 14, and 15 (in a flip-chip device layers 16, 17, and 18), which are relatively far from the liquid crystal.

The conventional method 40 may also be difficult and time consuming to perform. The removal of layers of the semiconductor device in step 42 typically is performed using chemical etching or parallel lapping techniques. Removal of layers of the semiconductor die 10 in step 42 is performed with a focused ion beam (FIB) mill. Milling layers of the die 10 may take a significant amount of time. In addition, during etching in step 42, portions of one or more metal layers 13–18 may be inadvertently removed. Thus, the $V_{CC}$ to ground short may be removed during milling. This makes detection of shorts more difficult.

The present invention provides a system and method for detecting a type of short of a plurality of types of shorts in a circuit in a semiconductor device. The circuit includes a plurality of power supply lines and a plurality of ground lines. The short is between at least one of the plurality of power supply lines and at least one of the plurality of ground lines. In one aspect, the method and system comprise providing a library including a plurality of sets of current-voltage characteristics. Each of the plurality of sets of current-voltage characteristics is for a particular type of short of the plurality of types of shorts. In this aspect, the method and system further comprise measuring a particular set of current-voltage characteristics of the semiconductor device and comparing the particular set of current-voltage characteristics to the plurality of sets of current-voltage characteristics in the library. The type of short may be determined based on the comparison between the particular set of current-voltage characteristics and the plurality of sets of current-voltage characteristics in the library. In another aspect, the method and system provide a tool for detecting the type of a short. In this aspect, the method and system comprise creating a plurality of types of shorts in a functioning semiconductor device, measuring a plurality of sets of current-voltage characteristics for the functioning semiconductor device, and saving the plurality of sets of current-voltage characteristics in a library.

The present invention will be described in terms of a particular semiconductor device and shorts created at particular levels. However, one of ordinary skill in the art will readily recognize that this method and system will operate effectively for other types of semiconductor devices and shorts created at other areas.

Figure 3:
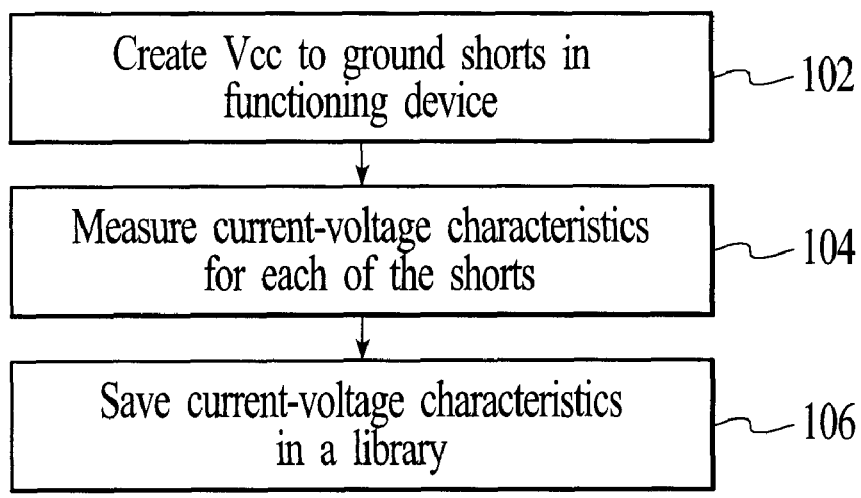
FIG. 3 is a flow chart depicting a method for creating a library for use in detection of $V_{CC}$ to ground shorts in accordance with the present invention.

To more particularly illustrate the method and system in accordance with the present invention, refer now to FIG. 3 depicting a flow chart of a method 100 in accordance with the present invention. Ground to $V_{CC}$ shorts in or between different metal layers 13–18 may be considered different types of shorts. The method 100 aids in the detection of different types of shorts. Thus, the method 100 aids an experimenter in determining the depth of the short.

$V_{CC}$ to ground shorts are created in a functioning device, via step 102. In one embodiment, step 102 include making shorts having different locations in the functioning device. Shorts of different locations carry different amounts of current and may affect the current-voltage characteristics of the device. A set of current-voltage characteristics is measured for each of the shorts, via step 104. In a preferred embodiment, step 104 includes applying different voltages at the power supply and measuring the resulting current and voltages within the circuits. The current-voltage characteristics for each of the shorts are then saved in a library, via step 106. The library created using the method 100 can then be used in detection of $V_{CC}$ to ground shorts.

Figure 4:
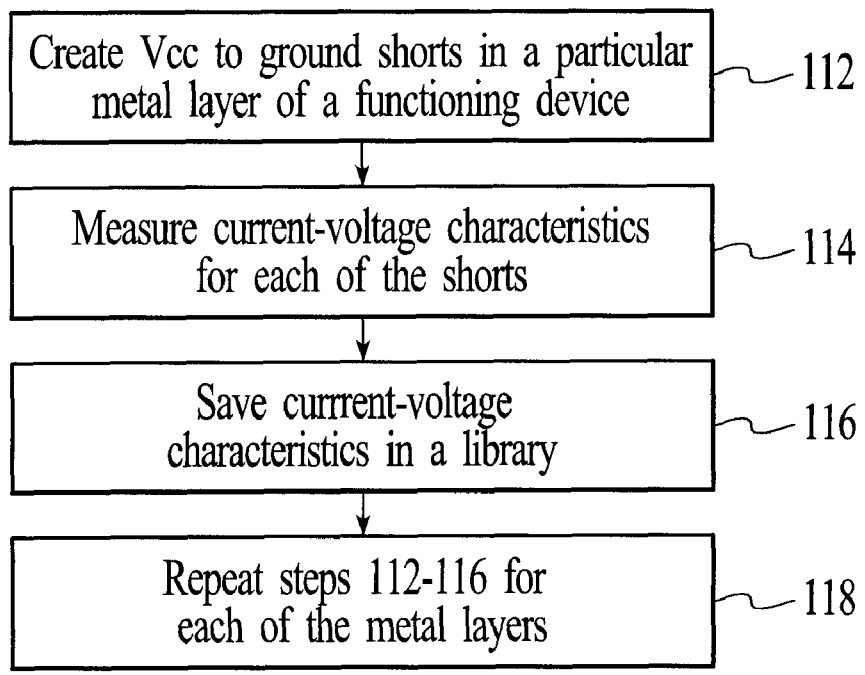
FIG. 4 is a more detailed flow chart of an embodiment of a method for creating a library for use in detecting $V_{CC}$ to ground shorts in accordance with the present invention.
Figure 5:
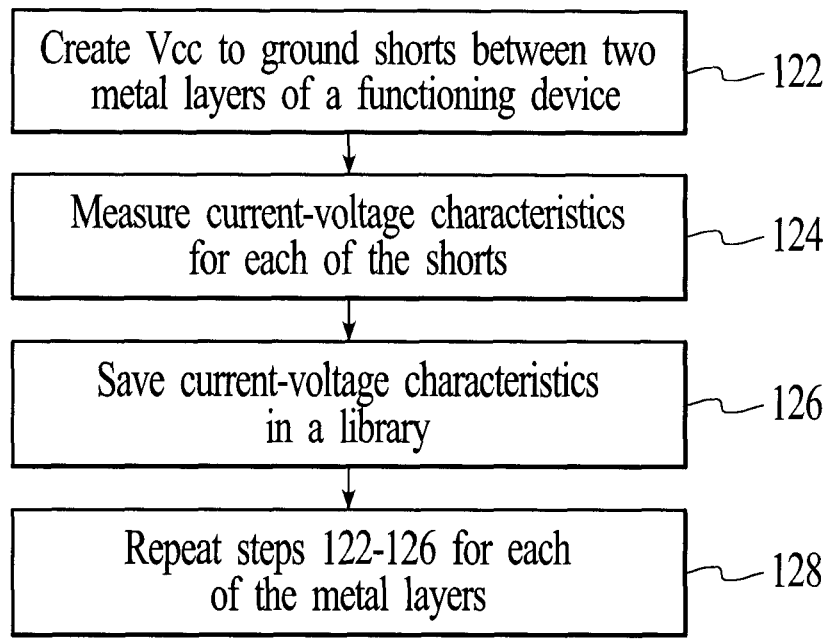
FIG. 5 is a more detailed flow chart of another embodiment of a method for creating a library for use in detecting $V_{CC}$ to ground shorts in accordance with the present invention.

FIGS. 4 and 5 depict more detailed flow charts of methods 110 and 120, respectively, of providing a library in accordance with the present invention. Although not depicted, the methods 110 and 120 could be combined. Referring now to FIG. 4, a $V_{CC}$ to ground short is created in a particular one of the metal layers 13–18, via step 112. In one embodiment, step 112 includes determining a portion of the active area 12 which can be milled without affecting the functioning of the circuits. In such an embodiment, step 112 also includes milling this portion of the active area to expose a particular metal layer 13, 14, 15, 16, 17, or 18. The $V_{CC}$ to ground short is then provided in the portion of the exposed metal layer 13, 14, 15, 16, 17, or 18. Via step 114, the current-voltage characteristics are then measured for the device having the short provided in step 112. The current-voltage characteristics for the short are then saved 28 in the library, via step 116. Steps 112 through 116 are then repeated for each of the metal layers, via step 118. In one embodiment, step 118 also includes repeating steps 112 through 116 for different shorts having different characteristics in each of the layers. In one embodiment, step 118 includes repeating steps 112 through 116 for shorts having different locations in each layer 13, 14, 15, 16, 17, or 18 as well as for different layers.

Referring now to FIG. 5, another embodiment of a method 120 for creating a library is depicted. A $V_{CC}$ to ground short is created between a number of the metal layers 13–18, via step 122. In one embodiment, step 122 includes determining a portion of the active area 12 which can be milled without affecting the functioning of the circuits. In such an embodiment, step 122 also includes milling this portion of the active area to expose at least two of the metal layers 13–18. The $V_{CC}$ to ground short is then provided in the portion of the exposed metal layers 13–18. Via step 124, the current-voltage characteristics are then measured for the device having the short provided in step 122. In a preferred embodiment, step 124 includes measuring the current-voltage characteristics between at least two points on the device. At least two points are used because different points on the device may have different resistances. The current-voltage characteristics for the short are then saved in the library, via step 126. Steps 122 through 126 are then repeated for each of the metal layers, via step 128. Thus, in one embodiment, step 128 ensures that all combinations of shorts between layers are investigated. In one embodiment, step 128 also includes repeating steps 122 through 126 for different shorts having different characteristics in each of the layers. For example, in one embodiment, step 128 includes repeating steps 122 through 126 for each different sized shorts in each layer 13, 14, 15, 16, 17, or 18 as well as for different layers.

Thus, a library of current-voltage characteristics is created via the methods 100, 110, 120, or some combination thereof. The current-voltage characteristics for each type of short differ. The current-voltage characteristics for shorts in different metal layers 13–18 or between different metal layers 13–18 are unique. Thus, the library of current-voltage characteristics created by making shorts in a functioning device can be used in detecting the type of $V_{CC}$ to ground shorts in a non-functioning device.

Figure 6:
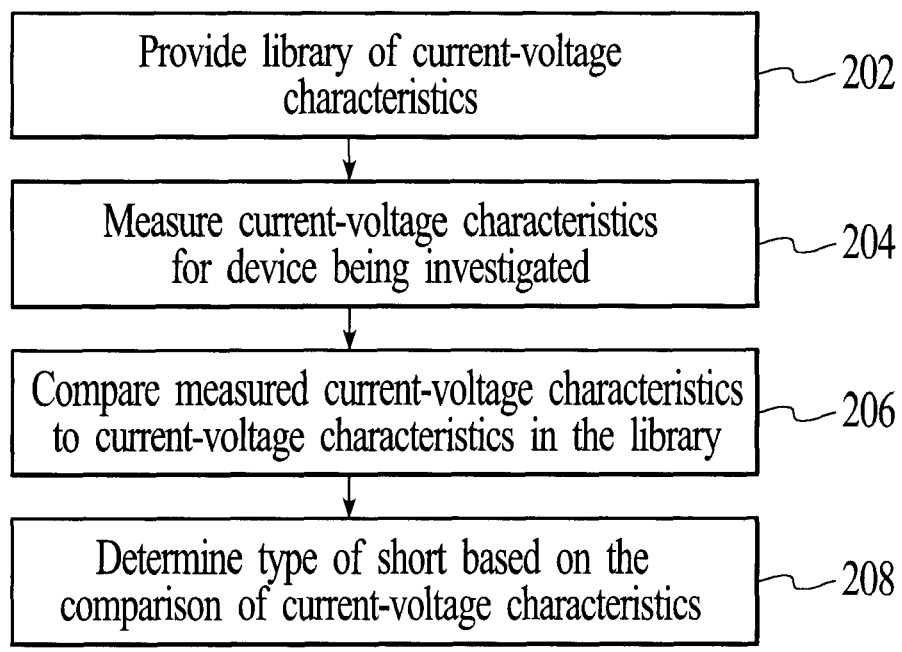
FIG. 6 is a flow chart depicting a method for detecting $V_{CC}$ to ground shorts using the library in accordance with the present invention.

FIG. 6 depicts a method 200 for detecting $V_{CC}$ to ground shorts in a semiconductor device in accordance with the present invention. A library is provided, via step 202. Preferably, step 202 is accomplished using a combination of the methods 110 and 120. The current-voltage characteristics for the device being investigated are then measured, via step 204. In a preferred embodiment, step 204 includes measuring the current-voltage characteristics between at least two points on the device. Preferably, these points correspond to the points measured on step 124 of FIG. 5. Referring back to FIG. 6, the current-voltage characteristics just measured are then compared to the current-voltage characteristics stored in the library, via step 206. Using this comparison, the metal layer where the short occurred is then determined, via step 208.

Consequently, the type of $V_{CC}$ to ground short can be determined using a library of current-voltage characteristics created by providing shorts in a functioning device. Creating shorts in a functioning device is simpler than detecting the location of shorts in another device. Thus, creating the library from functioning devices is relatively simple. Moreover, the method 200 for detecting shorts is simpler and faster than the conventional methods 20 and 40. The method 200 is also particularly useful for complex devices having many metal layers 13–18 because shorts in some of these layers would be difficult to detect using conventional liquid crystal detection.

Because the method 200 is simpler and faster than conventional methods, the metal layer in which the short exists may be found relatively quickly. Because the metal layer(s) having the short can be determined relatively rapidly, the process which may be responsible for creating the short can be identified relatively quickly. Thus, processes that cause the shorts, such as etches which are insufficient, may then be rapidly corrected. The library can also be used by those completing fabrication of the semiconductor device to detect shorts. As a result, shorts can be detected more rapidly and without sending the devices to another lab for deprocessing. Again, processing can rapidly be altered to reduce or remove the $V_{CC}$ to ground shorts.

A method and system has been disclosed for a simpler, faster method for detecting $V_{CC}$ to ground shorts. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for detecting a type of a short of a plurality of types of shorts in a circuit in a semiconductor device, the circuit including a plurality of power supply lines and a plurality of ground lines, the short being between at least one of the plurality of power supply lines and at least one of the plurality of ground lines, the method comprising the steps of:

(a) providing a library including a plurality of sets of current-voltage characteristics, each of the plurality of sets of current-voltage characteristics being for a particular type of short of the plurality of types of shorts;

(b) measuring a particular set of current-voltage characteristics of the semiconductor device; and (c) comparing the particular set of current-voltage characteristics to the plurality of sets of current-voltage characteristics in the library;

wherein the type of short may be determined based on the comparison between the particular set of current-voltage characteristics and the plurality of sets of current-voltage characteristics in the library.

2. The method of claim 1 wherein the library providing step (a) further includes the steps of:

(a1) measuring each of the plurality of sets of current voltage characteristics in the library by creating the particular type of short in a functioning semiconductor device; and (a2) saving each of the plurality of sets of current-voltage characteristics in the library.

3. The method of claim 2 wherein the functioning semiconductor device further includes a plurality of levels of lines, the plurality of levels of lines including the plurality of power lines and the plurality of ground lines, and wherein the measuring step (a1) further includes the steps of:

(a1i) providing a first short between a portion of the plurality of power lines and a portion of the plurality of ground lines at a particular level of the plurality of levels;

(a1ii) measuring a set of current-voltage characteristics for the first short; and (a1iii) repeating steps (a1i) to (a1ii) for each of the plurality of levels.

4. The method of claim 3 wherein the measuring step (a1) further includes the steps of:

(a1iv) providing a second short between the portion of the plurality of power lines and the portion of the plurality of ground lines at the particular level of the plurality of levels, the second short being larger than the first short;

(a1v) measuring a second set of current-voltage characteristics for the second short; and (a1vi) repeating steps (a1iv) to (a1v) for each of the plurality of levels.

5. The method of claim 4 wherein the measuring step (a1) further includes the steps of:

(a1iv) removing the first short;

(a1v) providing a second short between a portion of the plurality of power lines and a portion of the plurality of ground lines at a third level of the plurality of levels;

(a1vi) measuring a set of current-voltage characteristics for the second short; and (a1vii) repeating steps (a1v) to (a1vi) for each of the plurality of levels.

6. The method of claim 2 wherein the functioning semiconductor device further includes a plurality of levels of lines, the plurality of levels of lines including the plurality of power lines and the plurality of ground lines, and wherein the measuring step (a1) further includes the steps of:

(a1i) providing a first short between a portion of the plurality of power lines at a first level of the plurality of levels of lines and a portion of the plurality of ground lines at a second level of the plurality of levels of lines;

(a1ii) measuring a set of current-voltage characteristics for the first short; and (a1iii) repeating steps (a1i) to (a1ii) for the plurality of levels.

7. The method of claim 6 wherein the measuring step (a1) further includes the steps of:

(a1iv) providing a second short between the portion of the plurality of power lines at the first level of the plurality of levels of lines and the portion of the plurality of ground lines at the second level of the plurality of levels of lines, the second short being larger than the a first short;

(a1v) measuring a second set of current-voltage characteristics for the second short;and (a1vi) repeating steps (a1iv) to (a1v) for the plurality of levels.

8. A method for providing a tool for use in detecting a type of a short of the plurality of types of shorts in a circuit in a semiconductor device, the circuit including a plurality of power supply lines and a plurality of ground lines, the short being between at least one of the plurality of power supply lines and at least one of the plurality of ground lines, the method comprising the steps of:

(a) creating a plurality of types of shorts in a functioning semiconductor device;

(b) measuring a plurality of sets of current-voltage characteristics for the functioning semiconductor device; and (c) saving the plurality of sets of current-voltage characteristics in a library.

9. A system for detecting a type of a short of a plurality of types of shorts in a circuit in a semiconductor device, the circuit including a plurality of power supply lines and a plurality of ground lines, the short being between at least one of the plurality of power supply lines and at least one of the plurality of ground lines, the system comprising:

a library including a plurality of sets of current-voltage characteristics, each of the plurality of sets of current-voltage characteristics being for a particular type of short of the plurality of types of shorts;

means for measuring a particular set of current-voltage characteristics of the semiconductor device;

wherein the type of short is determined based on a comparison of the particular set of current-voltage characteristics to the plurality of sets of current-voltage characteristics in the library.

10. The system of claim 9 wherein each of the plurality of sets of current-voltage characteristics include a measurement on a functioning semiconductor device having the particular type of short created therein.

11. The system of claim 10 wherein the functioning semiconductor device further includes a plurality of levels of lines, the plurality of levels of lines including the plurality of power lines and the plurality of ground lines, and wherein the particular type of short includes a first short between a portion of the plurality of power lines and a portion of the plurality of ground lines at a particular level of the plurality of levels.

12. The system of claim 11 wherein the particular type of short further includes a second short between the portion of the plurality of power lines and the portion of the plurality of ground lines at the particular level of the plurality of levels, the second short being larger than the first short.

13. The system of claim 12 wherein the particular type of short further includes a second short between the portion of the plurality of power lines at the first level of the plurality of levels of lines and the portion of the plurality of ground lines at the second level of the plurality of levels of lines, the second short being larger than the first short.

14. The system of claim 12 wherein the particular type of short further includes a second short between a portion of the plurality of power lines and a portion of the plurality of ground lines at a third level of the plurality of levels.

15. The system of claim 10 wherein the functioning semiconductor device further includes a plurality of levels of lines, the plurality of levels of lines including the plurality of power lines and the plurality of ground lines, and wherein the particular type of short further includes a first short between a portion of the plurality of power lines at a first level of the plurality of levels of lines and a portion of the plurality of ground lines at a second level of the plurality of levels of lines.

16. A system for providing a tool for use in detecting a type of a short of the plurality of types of shorts in a circuit in a semiconductor device, the circuit including a plurality of power supply lines and a plurality of ground lines, the short being between at least one of the plurality of power supply lines and at least one of the plurality of ground lines, the method comprising the steps of:

means for creating a plurality of types of shorts in a functioning semiconductor device;

means for measuring a plurality of sets of current-voltage characteristics for the functioning semiconductor device; and means for saving the plurality of sets of current-voltage characteristics in a library.

\* \* \* \* \*